United States Patent [19]

Rumfield et al.

[11] Patent Number: 5,245,289
[45] Date of Patent: Sep. 14, 1993

[54] CIRCUIT BREAKER INTERRUPTER SEQUENCE MONITOR

[75] Inventors: Lance T. Rumfield, Spring; Charles W. Fromen, Houston, both of Tex.

[73] Assignee: Houston Industries Incorporated, Houston, Tex.

[21] Appl. No.: 979,443

[22] Filed: Nov. 20, 1992

Related U.S. Application Data

[63] Continuation of Ser. No. 789,933, Nov. 12, 1991, abandoned.

[51] Int. Cl.⁵ .................. G01R 31/02; G01R 31/32
[52] U.S. Cl. ........................ 324/424; 324/521; 324/524; 361/44; 361/47
[58] Field of Search ............ 361/44, 47; 341/12, 341/117, 153; 307/360, 264, 268, 261; 324/424, 521, 522, 524

[56] References Cited

U.S. PATENT DOCUMENTS

| | | | |
|---|---|---|---|
| 2,993,202 | 7/1961 | Halonen | 341/153 |
| 3,699,391 | 10/1972 | Eilts | 361/47 |
| 4,281,316 | 7/1981 | Simon | 341/112 |

FOREIGN PATENT DOCUMENTS

0467390  11/1975  U.S.S.R. ................ 341/112

OTHER PUBLICATIONS

Circuits & System Design, RTR-84 Circuit Breaker Response Recorder (8 pages), Jul. 1990.
Advertisement, Transmission & Distribution, Jun. 1990, p. 17.

Primary Examiner—Kenneth A. Wieder
Assistant Examiner—Jose M. Solis
Attorney, Agent, or Firm—Pravel, Hewitt, Kimball & Krieger

[57] ABSTRACT

The operation of energized substation circuit breakers in electrical power distribution systems is directly monitored. For each circuit breaker in a multi-phase breaker arrangement, the flow of electrical current is sensed. A signal is then formed for each phase representative of the sensed current flow. The signals so formed for the multi-phases are combined into a composite waveform for monitoring and diagnostic purposes. In the composite waveform, the signal for each phase of the circuit breaker is identifiable by its time relationship to others and by a distinctive voltage level.

10 Claims, 2 Drawing Sheets

CIRCUIT BREAKER INTERRUPTER SEQUENCE MONITOR

This is a continuation of co-pending application Ser. No. 07/789,933 filed on Nov. 12, 1991, now abandoned.

BACKGROUND OF INVENTION

1. Field of Invention

The present invention relates to monitors for circuit breakers in electrical power distribution systems.

2. Description of Prior Art

It has long been necessary for electrical power utilities to perform routine maintenance tests on power distribution equipment. One type of such equipment on which maintenance has been particularly important from a standpoint of safety and security has been power circuit breakers. These circuit breakers are quite large and very expensive. They operate in multi-phase service conditions where each breaker must carry voltages in ranges as high as several tens of thousands of volts and current levels of several hundred or more amperes.

One established testing procedure was to periodically remove the circuit breaker from active service and verify circuit breaker performance through a series of tests. Examples of such tests were timing, micro-ohm and insulation tests. The information obtained during these out-of-service tests was very useful. However, as has been pointed out, it was necessary to remove the circuit breakers from service to perform these types of tests.

It was a costly process to remove such a power circuit breaker from service for maintenance testing. It was also difficult to schedule the tests because the uncertainty of service demand levels limited equipment availability scheduling. Due to the adverse effect on system power delivery of removal of certain portions of the power distribution equipment from service, scheduled testing often was delayed or even cancelled.

More recently, test equipment has become available to monitor and record functions of the control circuit mechanisms associated with the power circuit breakers without removing the circuit breakers from active service. These control circuit monitors offered the advantage that the circuit breaker did not have to be removed from service for testing. There still remained the drawback that the actual components of the circuit breaker involved in breaking the electrical power circuit were not tested while in actual service. This monitoring and recording test equipment did, at least, provide certain information by monitoring electrical signals in the control circuits associated with the power circuit breakers.

Situations have still, though, been known to be likely to occur where the electrical control circuitry of the breakers was performing satisfactorily and the circuit breaker thus would be deemed acceptable. In actuality, it could later develop that although the control circuitry was satisfactory, this was a misleading indication. The actual components of the circuit breaker involved in physically breaking the flow of current were either worn or defective and these shortcomings had gone undetected during control circuitry testing.

SUMMARY OF INVENTION

Briefly, the present invention relates to test equipment for multi-phase electrical power circuit breakers. The present invention provides a new and improved apparatus for monitoring the operation of a circuit breaker as the circuit breaker is switched while operating.

In the apparatus of the present invention, the operation of the circuit breaker is monitored as the circuit breaker is interrupted or opened as well as when the circuit breaker is closed. The flow of electrical current for the circuit breaker for each phase is sensed. A signal is then formed for each phase based on the sensed flow of electrical current in such phase. The signals formed for each phase are then combined into a composite waveform which is used in a display for monitoring and diagnostic phases.

In the apparatus according to the present invention, the signals for each phase which are combined into a composite waveform are formed in a manner to identify the sensed flow of electrical current in each of the phases by time relationship. The signals formed for each phase are also provided with an identifying characteristic which is indicative of the particular phase of the multi-phase currents flowing through the circuit breaker. In the preferred embodiment, the identifying characteristic provided in the signals as formed is a distinctive, assigned voltage level.

DESCRIPTION OF THE PREFERRED EMBODIMENT

Figure 1:
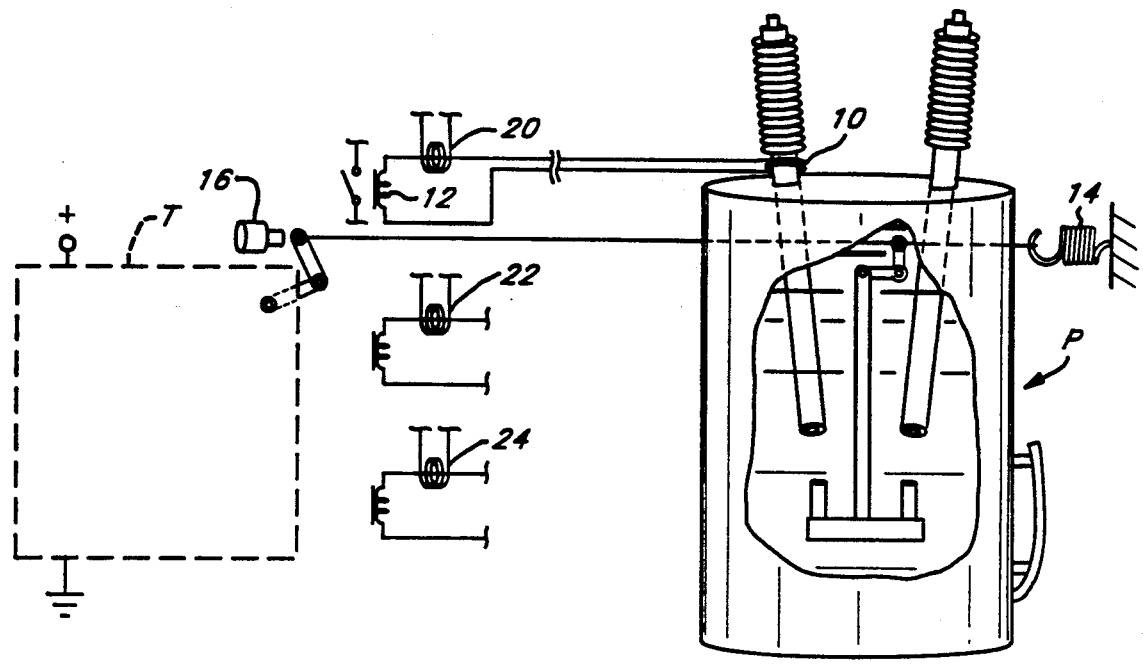
FIG. 1 is a schematic diagram of a circuit breaker whose operation is monitored by an apparatus according to the present invention.

In the drawings, a conventional power circuit breaker P is shown (FIG. 1) schematically. The circuit breaker P is shown by way of example only and may be any of numerous commercially available types. The power circuit breaker P may carry voltages of several tens of thousands of volts and current levels of a hundred or more amperes. As is typical, the circuit breaker P is one of several, typically three, in a multi-phase circuit breaker arrangement. As is also customary, a current sensing coil 10 of a conventional breaker auxiliary switch test system T is mounted at one of the terminals conducting electrical current through the circuit breaker P.

The coil 10 carries electrical current electromagnetically induced therein when the conductor to the circuit breaker P is carrying electrical current through it. Typically, the coil 10 carries a current which is a small fraction, such as one-tenth or one-twentieth of the amplitude, of the current flowing in the circuit breaker P.

The current from the coil 10 is provided to a trip relay 12 of the breaker test system T. The breaker test system T generally includes at least the following electrical components: a trip switch, a trip coil, a close switch, auxiliary switches and indicator lights. Such circuit elements in the test system T are conventional and well known in the art and the component details are consequently not shown in the drawings.

The circuit breaker P also includes several mechanical operating components also shown schematically in FIG. 1: a mechanical energy storage spring 14, termed in the art a tail spring, to store mechanical energy for the purpose of opening or closing the contacts within the circuit breaker P; and a shock absorber/damper piston 16 to absorb forces caused by rapid breaker contact movement during interruption operations, either closing or opening of the circuit breaker P.

Figure 2:
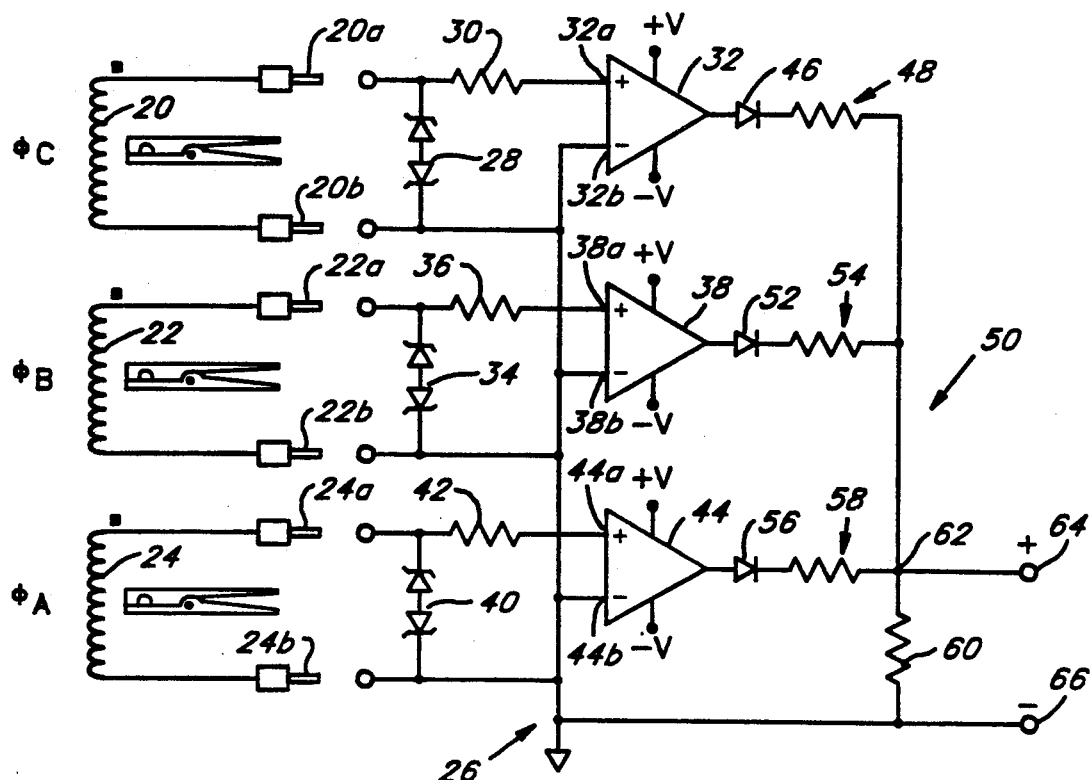
FIG. 2 is a schematic electrical circuit diagram of an apparatus according to the present invention.

A monitor apparatus M of the present invention (FIG. 2) includes a current sensing transformer coil, such as indicated at 20 (FIGS. 1 and 2) for each power circuit breaker for the multi-phases of electrical power. The current transformer coils for each of the power circuit breakers are preferably of the clip-on current transformer type as schematically indicated, providing an output current proportional to the current flowing between the current sensing coil 10 and the trip relay 12 for each circuit breaker connected to the breaker test system T.

For a three-phase circuit breaker arrangement, three circuit breakers each like the circuit breaker P are electrically connected by their respective current sensing coils and trip relays to the test system T. Thus, three current transformers 20, 22 and 24, each located as indicated at 10 on an associated conductor with its current sensing coil are provided in the monitor apparatus M. Each of these three current transformers is provided for an associated one of the three phases, each phase having a circuit breaker connected to the test system T.

The clip-on current transformers 20, 22 and 24 serve as inputs to three separate channels in the monitor apparatus M (FIG. 2), each such channel being assigned to one of the three phases, designated A, B and C, of electrical power. In the embodiment shown, the phase rotation is in the following sequence: C, B, A. The current transformers 20, 22 and 24 are commonly aligned to sense like directions of electromagnetic flux. The current transformers accordingly provide output currents both proportional to the input current and of like polarity to the polarity of the current flowing in the associated current sensing coils on the circuit breakers.

The current transformer 20 for phase C has connector jacks or plugs 20a and 20b which are connected as input terminals for a signal forming/conditioning circuit 26. Similarly, current transformer 22 for phase B has connectors 22a and 22b provided as input terminals to the signal forming/conditioning circuit 26, while current transformer 24 for phase A has connector terminals or plugs 24a and 24b for connection to the signal conditioning circuit 26.

In the signal conditioning circuit 26, the current received from the current transformer 20 is provided across a voltage regulating diode arrangement 28 through an input resistor 30 to a positive input terminal 32a of an operational amplifier 32. Operational amplifier 32 is configured and connected as indicated to be allowed to fully saturate. In a like manner, the signal received from the current transformer 22 for phase B is provided across a voltage regulating diode arrangement 34 through an input resistor 36 to a positive input terminal 38a an operational amplifier 38, again configured to be allowed to fully saturate. The signal from phase A received from the current transformer 24 is provided across a voltage regulating diode arrangement 40 through an input resistor 42 to a positive input 44a of an operational amplifier 44, again configured to be allowed to fully saturate.

Each of the operational amplifiers 32, 38 and 44 operates as a comparator with a zero or ground voltage being provided at its negative input 32b, 38b and 44b, respectively. As configured, the output of each of the operational amplifiers 32, 38 and 44 rises to an established voltage level, such as nine or so volts, on each positive half cycle of current from the current transformers connected therewith, regardless of the amplitude of the input current.

The output of the operational amplifier 32 is furnished through an isolating diode 46 to a scaling resistor 48 of a voltage divider network 50. An isolating diode 52 is connected at the output of the operational amplifier 38 to provide a signal to a scaling resistor 54 of the voltage divider network 50. Finally, an isolating diode 56 is connected at the output of the operational amplifier 44 to furnish a signal through a scaling resistor 58 of the voltage divide network 50.

The resistance values of the resistors 48, 54 and 58 of the voltage divider network 50 are selected according to a scaling ratio. For example, the resistance of resistor 54 is twice that of resistor 48, while the resistance of resistor 58 is three times that of resistor 48. The resistors 48, 54 and 58 are electrically connected in common to a resistor 60 at a node 62, connected for negative reference to ground as are the negative inputs of operational amplifiers 32, 38 and 44. The signal at the node 62 is provided at an output terminal 64 for connection to a suitable display, such as a chart recorder or oscilloscope for monitoring and diagnostic purposes. A ground or reference voltage is provided at an output terminal 66.

In the operation of the present invention, the circuit breakers to be tested are connected into a parallel feed arrangement with another bank of circuit breakers. In this manner, the circuit breakers being tested are operating and serving a load during testing. The parallel feed arrangement is established as a safeguard to protect against loss of service while the circuit breakers in question are being tested.

The apparatus M is then connected by current transformers 20, 22 and 24 to the lines connecting the current sensing coils, such as 10, to the trip relays, such as 12, for each phase of the circuit breaker test system T. The apparatus M may be used as a separate unit or may be used in conjunction with commercially available circuit breaker response recorders, such as those sold by Circuit & Systems Design of Lisburn, Northern Ireland, particularly including the Model RTR-84 Circuit Breaker Response Recorder.

Figure 3:
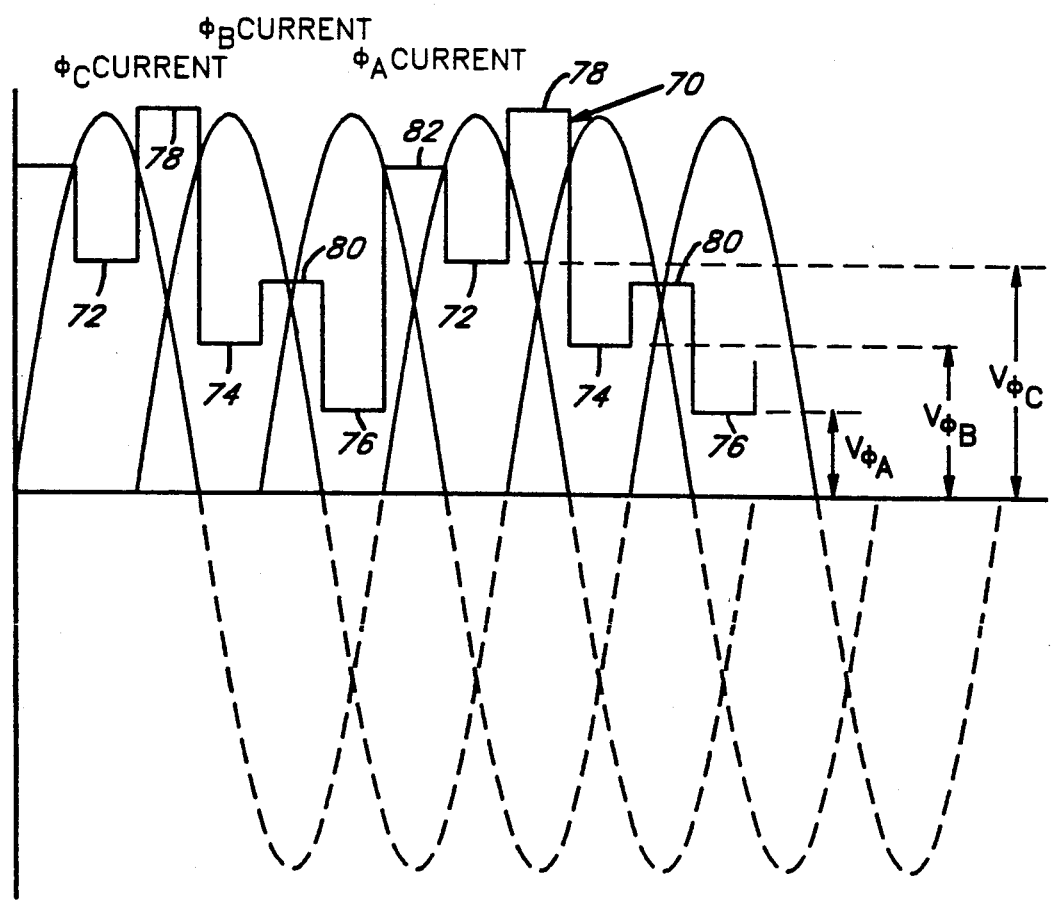
FIG. 3 is a waveform diagram of waveforms present in the apparatus of FIG. 2.

In connecting the current transformers 20, 22, and 24, care is taken to insure proper alignment of the coils to sense currents (FIG. 3) of like polarity to the phases in the multi-phase circuit breakers under test. The three-phase current waveform shown in FIG. 3 are of approximately equal amplitude in situations where approximately equal loads are being served. It should be understood that this is an example situation which occurs when the approximately equal loads are present. In the event that the loads differ, the waveform amplitudes for currents in the three phases vary accordingly.

A waveform 70 is formed in the apparatus M at the output terminal 64 for connection to a display or recorder for monitoring and diagnostic purposes. The waveform 70 is a summation of the voltage output levels from the operational amplifiers 32, 38 and 44, as adjusted by the resistance values of the resistors 48, 54 and 58.

During those time intervals when only the current for phase C is positive, as indicated at 72, the waveform 70 is at a distinctive voltage level indicative of the presence of phase C current. Similarly, during time intervals when only the current for phase B is positive, as indicated at 74, the waveform 70 is at a distinctive voltage level indicative of the presence of phase B current in the circuit breakers being tested. When only the current for phase A is positive, indicated in waveform 70 at 76, a distinctive voltage level occurs in the waveform 70 indicative of the presence of phase A current in the circuit breaker arrangement being tested.

It can thus be seen that the waveform or signal 70 formed in apparatus M is an identifying signal. As indicated at 72, 74 and 76 the identifying signal 70 formed in apparatus M identifies the sensed flow of electrical current in each of the phases. The time sequence of appearance of portions 72, 74 and 76 of identifying signal 70 is indicative of the time relationship or phase sequence: C, B, A of phase rotation in the electrical power associated with the circuit breakers under test. Further, the distinctive voltage levels formed in the apparatus M at portions 72, 74 and 76 are indicative of the respective particular phase C, B, and A, respectively of the multi-phase currents flowing through the circuit breakers.

When both phase C and phase B currents are present and positive, as indicated at 78, the waveform 70 is a sum of the voltage levels at the outputs of operational amplifiers 32 and 38, indicative of the presence concurrently of phase C and phase B currents. When currents are simultaneously present and positive for phase B and phase A, as indicated at 80, the waveform 70 is sum of the voltage levels at the outputs of operational amplifiers 38 and 44, indicating the presence of currents simultaneously in phases C and B. Finally, when both phase C and phase A are conducting current and positive in polarity, as indicated at 82, the waveform 70 is a sum of the voltage levels present at the outputs of operational amplifiers 32 and 44, indicating the presence of currents in phases C and phases A contemporaneously. The composite or sum signals present at these times are not, however, indicative of single particular phases and are not as significant as the voltage levels and time relationships at portions 72, 74 and 76 in waveform 70.

Figure 4:
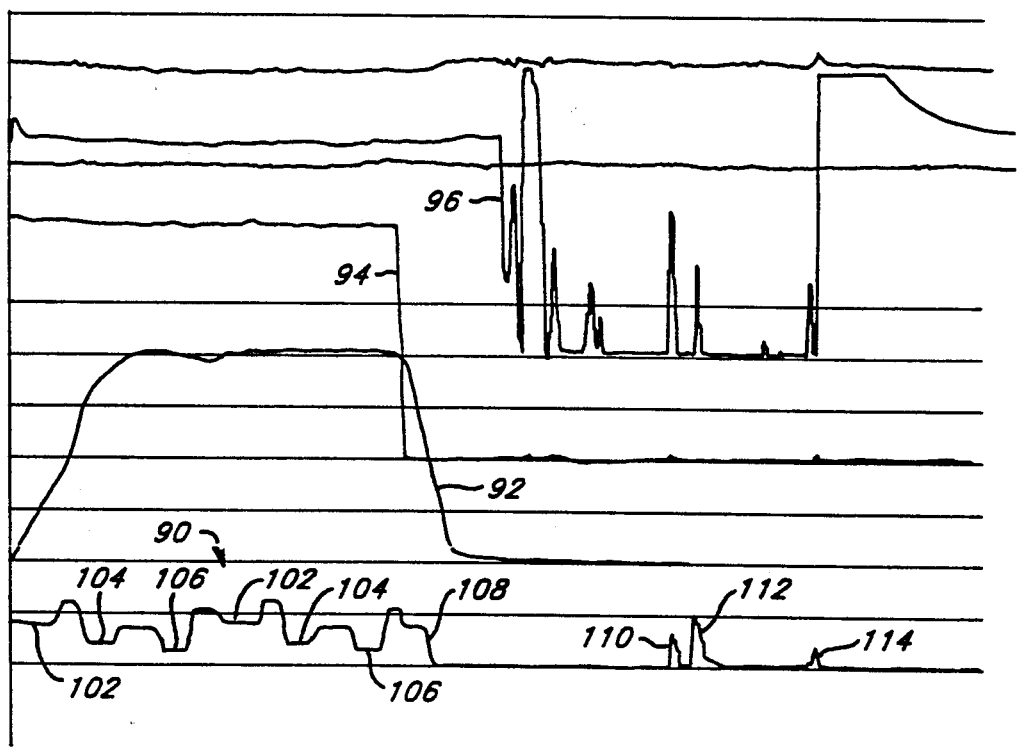
FIG. 4 is a waveform diagram of an example output signal formed by an apparatus according to the present invention.

In FIG. 4, a waveform 90 is presented representing an example waveform present at an output terminal 64 of an apparatus M of the present invention. The waveform 90 is plotted on a chart recorder of the type provided by Circuit & Systems Design identified above, on a spare channel. The recorder of this type also senses and forms in portions of its own equipment a waveform 92 indicative of the current level through the trip coil of the test system T and waveforms 94 and 96 indicative of current flow through auxiliary switch contacts of the test system T.

Under normal operating conditions, the waveform 90 is of like configuration to the waveform 70 (FIG. 3), indicating at time intervals 102, 104 and 106, the distinctive voltage levels indicating the currents for phases C, B and A, in that time sequence or order, respectively.

when it is desired to test the components of the power circuit breaker P, the trip relay is closed, causing a drop in the level of the trip coil current waveform 92 and the auxiliary switch contact waveform 94, followed slightly later by a drop in switch contact waveform 96.

The waveform 90 formed by the apparatus M of the present invention indicates the opening of the circuit breaker P, as shown at 108. Because of the voltage level occurring as indicated at 102 prior to the drop in waveform indicated at 108, it is known that the power circuit breaker P carrying phase C current is the phase carrying current at the time the test system was actuated. The output terminal 64 of the apparatus M further indicates, as shown at 110 and again at 112 and 114, the presence of transients indicative of restrike conditions in the circuit breakers being tested. The presence of restrike conditions as indicated at 112 and 114 indicate problems detected in the mechanical components bank of circuit breakers being tested rather than by the test system T. The time of occurrence of the transients indicated at 112 and 114 as measured from the time indicated at 108 of opening the circuit breaker P further indicates which of the three phases had the restrike condition occur. In the example shown in the drawings, all three phases exhibited restrike conditions after the power circuit breaker P was opened under load conditions.

The foregoing disclosure and description of the invention are illustrative and explanatory thereof, and various changes in the size, shape, materials, components, circuit elements, wiring connections and contacts, as well as in the details of the illustrated circuitry and construction may be made without departing from the spirit of the invention.

We claim:

1. In test equipment for multi-phase electrical power circuit breakers, an apparatus for monitoring the operation of a circuit breaker as the circuit breaker is switched while operating, comprising:
   means for sensing the flow of electrical current for each phase through the circuit breakers;
   means for forming a voltage level for each of the phases indicative of the direction of current flow in that phase, based on the sensed flow of electrical current in such phase flowing through the circuit breaker; and
   means for combining in individually distinctive proportions each of the signals formed by said means for forming into a composite waveform, the individually distinctive proportions identifying by their presence in the composite waveform the sensed flow of electrical current in the circuit breaker switched at the time the test equipment is actuated.

2. The apparatus of claim 1, wherein said means for sensing comprises:
   current transformer means.

3. The apparatus of claim 1, wherein said means for combining comprises:
   means for combining the signals formed by said means for forming into a composite waveform identifying by the presence of the distinctive voltage levels and the time relationship the sensed flow of electrical current in each of the phases after the test equipment is actuated.

4. The apparatus of claim 1, wherein said means for sensing comprises:
   means for sensing the amount of electrical current for each phase through the circuit breakers.

5. The apparatus of claim 1, wherein said means for sensing comprises:
   means for sensing the flow of electrical current for each phase through the circuit breakers as the breaker is switched.

6. The apparatus of claim 1, wherein said means for sensing comprises:
   means for sensing the flow of electrical current for each phase through the circuit breakers as the breaker is opened.

7. The apparatus of claim 1, wherein said means for sensing comprises:

means for sensing the flow of electrical current for each phase through the circuit breakers as the breaker is closed.

8. The apparatus of claim 1, further including:

means for transferring the signal from said means for forming to a display for monitoring and diagnostic purposes.

9. In test equipment for a multi-phase electrical power circuit breaker, an apparatus for monitoring the operation of the circuit breakers in each phase as the circuit breakers are switched during the flow of electrical current therethrough, comprising:

sensor means in each phase of the multi-phases for sensing the electrical current flowing through such phase;

means associated with each of said sensor means for forming a voltage level for each of the phases indicative of the sensed direction of electrical current flow in a particular phase; and means for combining in individually distinctive proportions each of the signals formed for each phase into a composite signal, the individually distinctive proportions identifying by their presence in the composite signal the sensed electrical current in the circuit breaker carrying current at the time the circuit breakers are switched.

10. The apparatus of claim 9, wherein said means for combining comprises:

means for combining the signals formed for each phase into a composite signal identifying by the presence of the distinctive voltage levels and the time relationship the sensed electrical current in the circuit breakers after they are switched.

* * * * *